United States Patent
Zhao et al.

(10) Patent No.: US 9,153,277 B2
(45) Date of Patent: Oct. 6, 2015

(54) NEAR FIELD TRANSDUCER HAVING SACRIFICIAL STRUCTURE

(71) Applicant: SEAGATE TECHNOLOGY LLC, Cupertino, CA (US)

(72) Inventors: Tong Zhao, Eden Prairie, MN (US); Xiaoyue Huang, Eden Prairie, MN (US); Michael C. Kautzky, Eagan, MN (US); Hui Brickner, Savage, MN (US); Yi-Kuei Ryan Wu, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/535,522

(22) Filed: Nov. 7, 2014

(65) Prior Publication Data
US 2015/0131417 A1     May 14, 2015

Related U.S. Application Data

(60) Provisional application No. 61/901,614, filed on Nov. 8, 2013.

(51) Int. Cl.
| | |
|---|---|
| G11B 11/00 | (2006.01) |
| G11B 13/08 | (2006.01) |
| G11B 5/60 | (2006.01) |
| G11B 5/48 | (2006.01) |
| G11B 5/31 | (2006.01) |
| G11B 5/127 | (2006.01) |
| G03F 7/26 | (2006.01) |
| G03F 7/20 | (2006.01) |
| G11B 5/00 | (2006.01) |

(52) U.S. Cl.
CPC ............. *G11B 13/08* (2013.01); *G11B 5/314* (2013.01); *G11B 5/4866* (2013.01); *G11B 5/6082* (2013.01); *G11B 5/6088* (2013.01); *G03F 7/20* (2013.01); *G03F 7/26* (2013.01); *G11B 5/127* (2013.01); *G11B 2005/0021* (2013.01)

(58) Field of Classification Search
CPC ............... G11B 5/4866; G11B 2005/0021; G11B 5/314; G11B 2005/001; G11B 7/1387; G11B 5/3116; G11B 11/10554; G11B 5/3133; G11B 13/08
USPC ........... 369/13.33, 13.13, 13.32, 13.14, 13.03
See application file for complete search history.

(56) References Cited

U.S. PATENT DOCUMENTS

| | | | | |
|---|---|---|---|---|
| 8,339,740 | B2 * | 12/2012 | Zou et al. | 360/125.31 |
| 8,427,925 | B2 | 4/2013 | Zhao | |
| 8,830,800 | B1 | 9/2014 | Pitcher | |
| 8,934,198 | B2 * | 1/2015 | Zou et al. | 360/125.31 |
| 2013/0286799 | A1 | 10/2013 | Zhu | |
| 2014/0376342 | A1 * | 12/2014 | Wessel et al. | 369/13.33 |
| 2014/0376348 | A1 * | 12/2014 | Cheng et al. | 369/13.33 |
| 2014/0376350 | A1 * | 12/2014 | Cheng et al. | 369/13.33 |

OTHER PUBLICATIONS

U.S. Appl. No. 14/062,651, filed Oct. 24, 2013, Zou.

* cited by examiner

*Primary Examiner* — Ali Neyzari
(74) *Attorney, Agent, or Firm* — Mueting, Raasch & Gebhardt, P.A.

(57) ABSTRACT

Near field transducers (NFTs) and devices that include a peg having an air bearing region and an opposing back region, the back region including a sacrificial structure, a disc having a first surface in contact with the peg, and a barrier structure, the barrier structure positioned between the opposing back region of the peg and the first surface of the disc.

20 Claims, 4 Drawing Sheets

NEAR FIELD TRANSDUCER HAVING SACRIFICIAL STRUCTURE

CROSS REFERENCE TO RELATED APPLICATION

This application claims priority to U.S. Provisional Applications No. 61/901,614, entitled DEVICES INCLUDING NEAR FIELD TRANSDUCERS AND METHODS OF MAKING THE SAME, filed on Nov. 8, 2013, the disclosure of which is incorporated herein by reference thereto.

SUMMARY

Disclosed are near field transducers (NFTs) and devices that include a peg having an air bearing region and an opposing back region, the back region including a sacrificial structure, a disc having a first surface in contact with the peg, and a barrier structure, the barrier structure positioned between the opposing back region of the peg and the first surface of the disc.

Also disclose are systems that include a device having an energy source; a waveguide, the waveguide configured to transmit energy from the energy source; a near field transducer (NFT) the NFT including a peg having an air bearing region and an opposing back region, the back region having a sacrificial structure, a disc having a first surface in contact with the peg, and a barrier structure, the barrier structure positioned between the opposing back region of the peg and the first surface of the disc; and wherein the energy source is configured to transmit energy to the waveguide and the waveguide is configured to transmit energy to the NFT; and a magnetic writer; and magnetic recording media, wherein energy from the energy source is transmitted via the waveguide to the NFT and the NFT transmits energy to the magnetic recording media to assist the magnetic writer in writing data to the magnetic recording media.

Also disclosed are methods of forming a near field transducers (NFT), the method including forming a peg of the NFT, the peg having an air bearing region and an air bearing surface (ABS) and a back region, opposing the air bearing region, wherein the back region comprises a sacrificial structure; forming a barrier structure on at least the back region and the back surface of the peg; and forming a disc of the NFT, the disc positioned over at least the barrier structure.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

In some embodiments, a NFT can include a small peg and a large disk. The very high temperatures that the NFT reaches during operation can lead to deformation or recession of the peg during use. This can lead to failure of the NFT and the entire head. One of the leading hypotheses of the mechanism of NFT failure is vacancy migration induced void formation at the region of the tip of the peg. Sources of vacancies in the NFT peg material (it should also be noted that vacancies can also form in the disc/heat sink region) could include grain boundaries, defects introduced during deposition, etc. Upon heating, these vacancies precipitate as voids at thermodynamically and kinetically favored heterogeneous nucleation sites, such as corners and interfaces. This is driven by thermal stress fields, interfacial energy variations, and interface defects. Subsequently, vacancies in the NFT material (e.g., gold vacancies) flow from the NFT disc region towards the void, causing it to grow and leading eventually to peg recession. Therefore, a means to minimize the vacancy density in the NFT material is needed to lower or mitigate vacancy flow from the disc to the peg for improved NFT reliability.

Disclosed devices include an angled portion of the peg and a barrier structure which is generally located at the back end of the peg within the disc/heat sink region. Disclosed sacrificial structures are made to be more prone to void nucleation and growth than the desired peg tip at the ABS due to sharper geometry, and thus serves as a sink for vacancies. Such a void sink region is separated from the NFT material disc/heat sink by a barrier made of a material other than the NFT material. During HAMR operation, vacancies in the peg are driven into such a sink region, and the NFT material peg tip at the ABS is densified and saved from deformation. Consequently, the thermal stability of the NFT may be improved.

Figure 1:
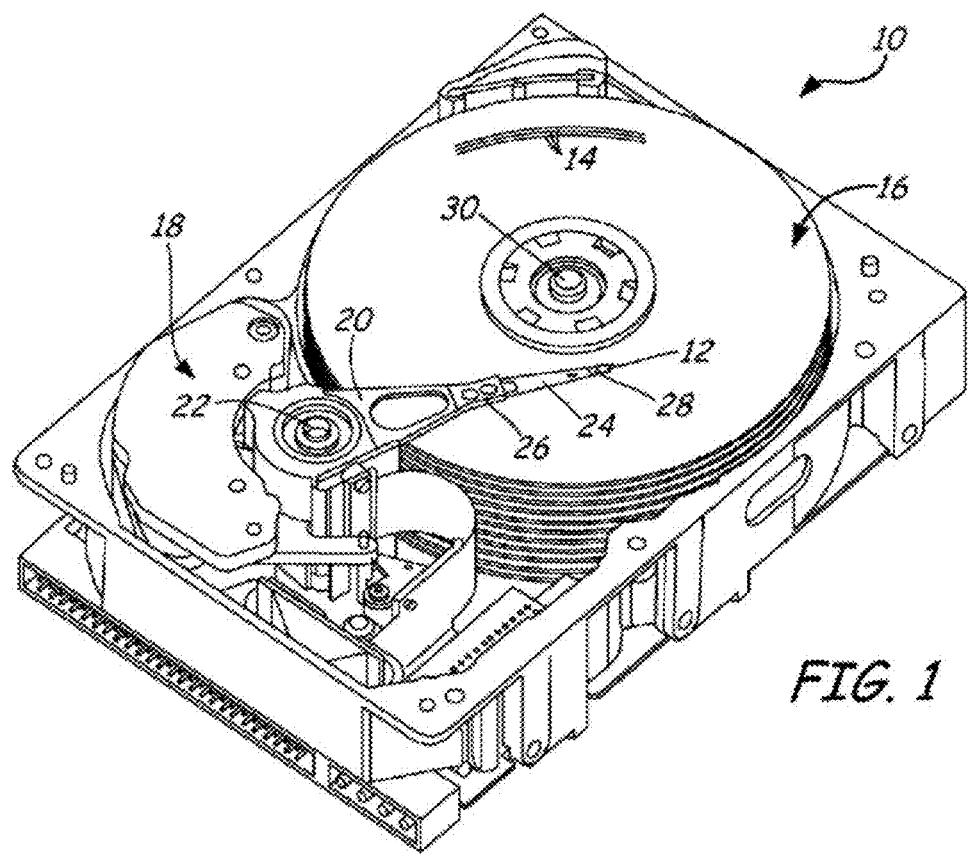
FIG. 1 is a perspective view of a magnetic disc drive that can include HAMR devices.

FIG. 1 is a perspective view of disc drive 10 including an actuation system for positioning slider 12 over track 14 of magnetic medium 16. The particular configuration of disc drive 10 is shown for ease of description and is not intended to limit the scope of the present disclosure in any way. Disc drive 10 includes voice coil motor 18 arranged to rotate actuator arm 20 on a spindle around axis 22. Load beam 24 is connected to actuator arm 20 at head mounting block 26. Suspension 28 is connected to an end of load beam 24 and slider 12 is attached to suspension 28. Magnetic medium 16 rotates around an axis 30, so that the windage is encountered by slider 12 to keep it aloft a small distance above the surface of magnetic medium 16. Each track 14 of magnetic medium 16 is formatted with an array of data storage cells for storing data. Slider 12 carries a magnetic device or transducer (not shown in FIG. 1) for reading and/or writing data on tracks 14 of magnetic medium 16. The magnetic transducer utilizes additional electromagnetic energy to heat the surface of medium 16 to facilitate recording by a process termed heat assisted magnetic recording (HAMR).

Figure 2:
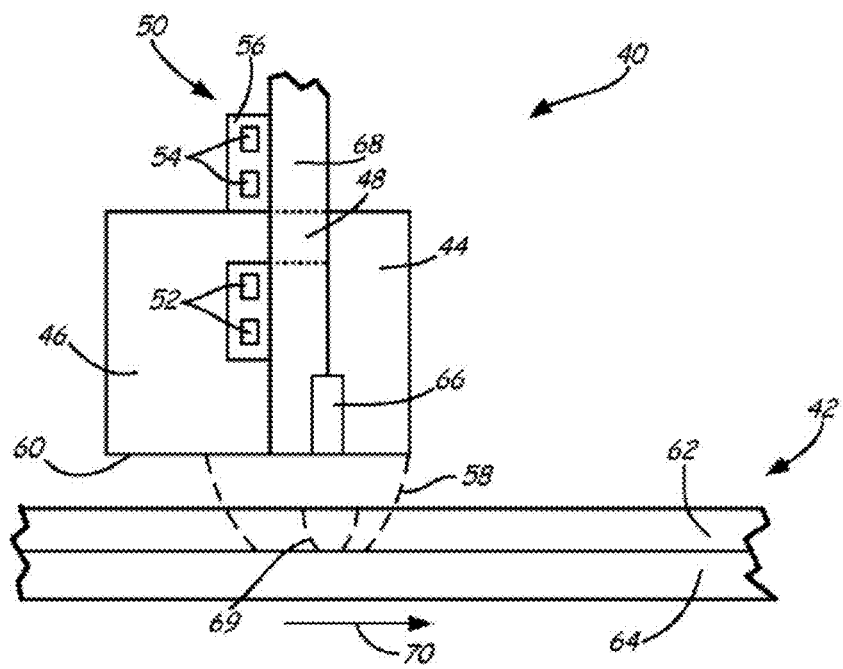
FIG. 2 is a cross sectional view of a perpendicular HAMR magnetic recording head and of an associated recording medium.

A HAMR transducer includes a magnetic writer for generating a magnetic field to write to a magnetic medium (e.g. magnetic medium 16) and an optical device to heat a portion of the magnetic medium proximate to the write field. FIG. 2 is a cross sectional view of a portion of a magnetic device, for example a HAMR magnetic device 40 and a portion of associated magnetic storage medium 42. HAMR magnetic device 40 includes write pole 44 and return pole 46 coupled by pedestal 48. Coil 50 comprising conductors 52 and 54 encircles the pedestal and is supported by an insulator 56. As shown, magnetic storage medium 42 is a perpendicular magnetic medium comprising magnetically hard storage layer 62 and soft magnetic underlayer 64 but can be other forms of media, such as patterned media. A current in the coil induces a magnetic field in the pedestal and the poles. Magnetic flux 58 exits the recording head at air bearing surface (ABS) 60 and is used to change the magnetization of portions of magnetically hard layer 62 of storage medium 42 enclosed within region 58. Near field transducer 66 is positioned adjacent the write pole 44 proximate air bearing surface 60. Near field transducer 66 is coupled to waveguide 68 that receives an electromagnetic wave from an energy source such as a laser. An electric field at the end of near field transducer 66 is used to heat a portion 69 of magnetically hard layer 62 to lower the coercivity so that the magnetic field from the write pole can affect the magnetization of the storage medium.

Devices disclosed herein can also include other structures. Devices disclosed herein can be incorporated into larger devices. For example, sliders can include devices as disclosed herein. Exemplary sliders can include a slider body that has a leading edge, a trailing edge, and an air bearing surface. The write pole, read pole, optical near field transducer and contact pad (and optional heat sink) can then be located on (or in) the slider body. Such exemplary sliders can be attached to a suspension which can be incorporated into a disc drive for example. It should also be noted that disclosed devices can be utilized in systems other than disc drives such as that depicted in FIG. 1.

Figure 3A:
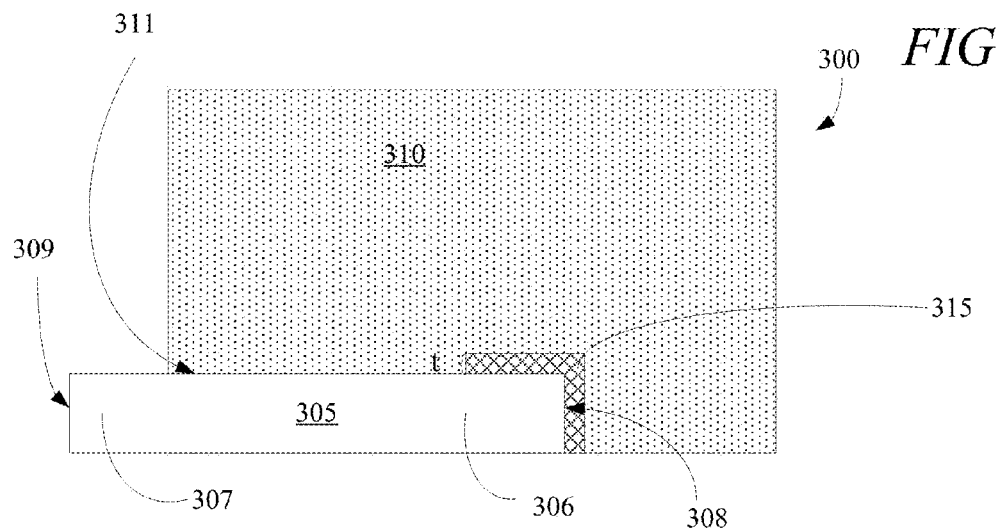
FIGS. 3A, 3B, and 3C are cross sectional (FIG. 3A), top down (FIG. 3B), and partial top down (FIG. 3C) views of disclosed devices.
Figure 3B:
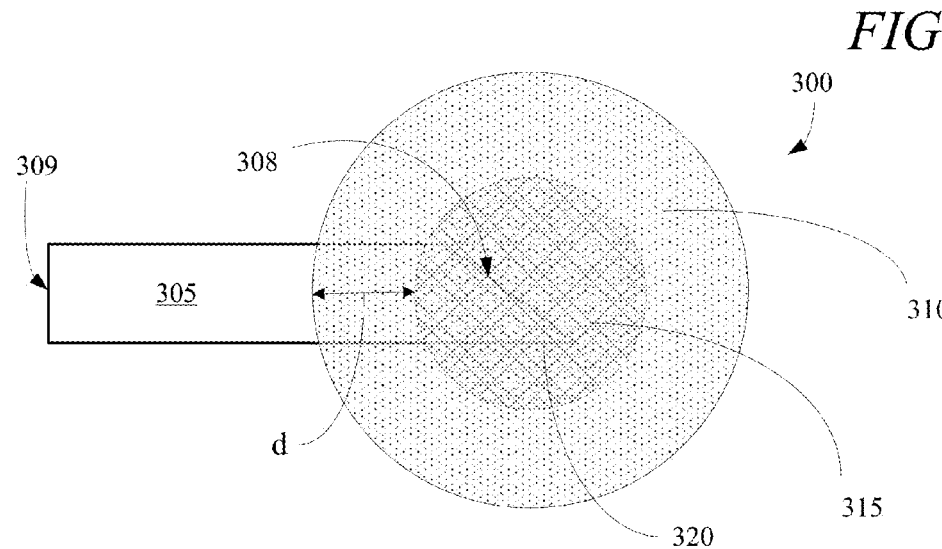
Figure 3C:
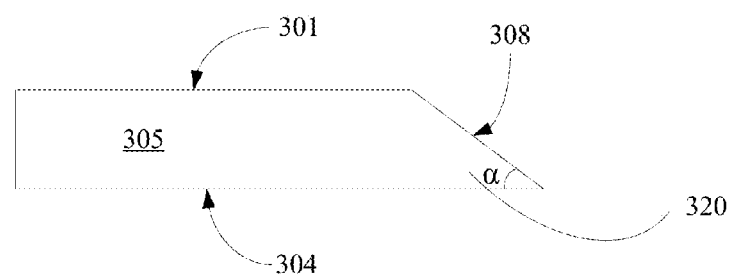

FIGS. 3A, 3B, and 3C depict various views of an illustrative disclosed near field transducer (NFT) 300. The NFT 300 includes a peg 305 and a disc 310, and can be referred to as a lollipop type NFT. In use, the peg 305 and the disc 310 function to gather energy input therein and focus it, via the peg 305 to obtain a smaller spot of energy which is then output to associated magnetic media. The peg 305 includes an air bearing region 307 and an opposing back region 306. The back region is described as the back because it is at a location removed from the air bearing surface 309, which can be considered the front of the device. The peg 305 also includes a back surface 308, opposite the air bearing surface 309. The disc 310 includes a first surface 311 that is in contact with the peg 305.

The peg 305 and the disc 310 can be made of the same or different materials. In some embodiments, various materials including, for example, gold (Au), silver (Ag), copper (Cu), aluminum (Al), alloys thereof, or other materials can be utilized to form the peg and disc. In some embodiments, the peg and disc can also be made of materials listed in United States Patent Publication No. 2013/0286799, U.S. Pat. No. 8,427, 925, U.S. Pat. No. 8,830,800, and U.S. patent application Ser. No. 14/062,651 entitled RECORDING HEADS INCLUDING NFT AND HEATSINK, filed on Oct. 24, 2013, the disclosures of which are incorporated herein by reference thereto. In some embodiments, both the peg and the disc are made of gold (Au).

The peg also includes a sacrificial structure 320. The sacrificial structure 320 can be made to be more prone to void nucleation and growth than other regions of the peg, particularly the air bearing region 307 of the peg. In some embodiments, the sacrificial structure 320 provides this function due to sharper geometry than the rest of the peg. The areas having sharper geometries can serve as a sink for vacancies. Sacrificial structures can most generically be described as including at least one angle that is less than 90 degrees. As such, a sacrificial structure 320 is different than a flat back surface of a peg (like the air bearing surface 309 of the peg) which would include two 90 degree angles. Two illustrative sacrificial structures could be described as a slanted back surface (such as that depicted in FIGS. 3B and 3C) or a pointed back surface (such as that depicted in FIGS. 4A and 4B).

One illustrative sacrificial structure can be seen in FIGS. 3B and 3C. In this peg, the back surface 308 is oblique to the air bearing surface 309 of the peg. Stated another way, the back surface 308 does not lie in the same plane as the air bearing surface 309. Stated yet another way, the back surface 308 is slanted. The sacrificial structure 320, which is part of and/or is formed by the back surface 308 is designed to provide a "sharp" corner where voids will be more likely to migrate to. Structurally, the back surface 308 and/or the sacrificial 320 of the peg 305 can be described geometrically. The back surface 308 can be described by the two angles that it forms. Because the peg in this illustrative example is a quadrilateral and the front two angles associated with the air bearing surface 309 are essentially 90 degrees each, the back two angles must add up to about 180 degrees. The sacrificial structure 320 in this case then is the pointed feature described by the angle $\alpha$, which is less than 90 degrees. In some embodiments, the angle $\alpha$ can be less than 70 degrees, in some embodiments less than 60 degrees, in some embodiments less than 45 degrees, and in some embodiments less than 30 degrees.

Figure 4A:
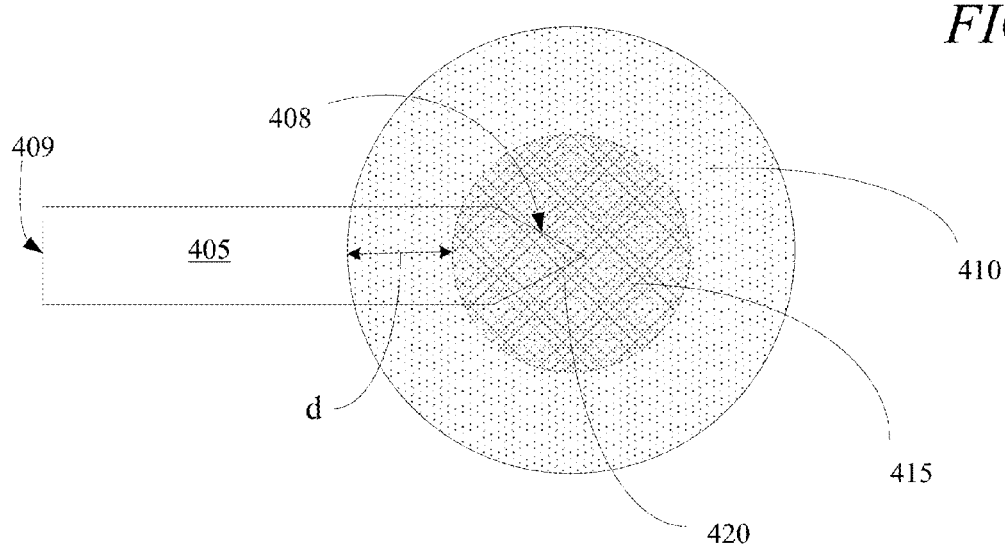
FIGS. 4A and 4B are top down (FIG. 4A), and partial top down (FIG. 4B) views of disclosed devices.
Figure 4B:
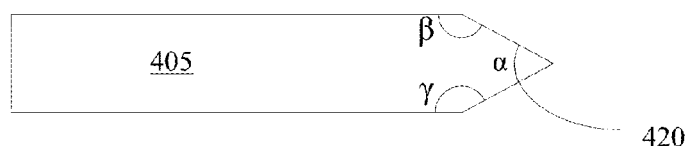

Another illustrative sacrificial structure can be seen in FIGS. 4A and 4B. This NFT 400 includes a peg 405, a disc 410, and a barrier structure 415. The peg 405 includes an air bearing surface 409 and an opposing back surface 408. The peg also includes a sacrificial structure 420 which is part of and/or formed by the back surface 408. The sacrificial structure 420 can be described as a pointed surface. The peg 405 in this embodiment is in effect a pentagon (five sides), and therefore its interior angles add up to 540 degrees. The front two angles associated with the air bearing surface 309 are essentially 90 degrees and therefore the remaining three angles ($\alpha$, $\beta$, and $\gamma$) add up to 360 degrees. In some embodiments $\beta$ and $\gamma$ can both independently be at least 135 degrees, and in some embodiments at least 160 degrees. As such, the angle $\alpha$ is less than 90 degrees, and therefore forms the sacrificial structure 420. In some embodiments, the angle $\alpha$ in the sacrificial structure 420 is less than 70 degrees, in some embodiments less than 60 degrees, and in some embodiments less than 45 degrees.

Figure 6:
FIG. 6 shows a cross section of an illustrative peg with an illustrative sacrificial structure.

Other illustrative sacrificial structures could include a serrated back surface (similar to the teeth on a saw blade), or sacrificial structures such as those seen in FIG. 6. FIG. 6 is a cross section of an illustrative peg. The peg 605 seen in FIG. 6 includes a sacrificial structure 620. The sacrificial structure 620 can be described as a portion of the peg that has at least one dimension (height or thickness) that is significantly smaller than the peg at the air bearing surface 609. In some embodiments, the sacrificial structure 620 has at least one dimension that is not greater than 30% of that same dimension of the peg at the air bearing surface. In some embodiments, the sacrificial structure 620 has at least one dimension that is not greater than 20% of that same dimension of the peg at the air bearing surface. Because of this smaller dimension, this region of the peg will be more prone to void formation and therefore can serve as a void sink. The illustrative sacrificial structure 620 in FIG. 6 could be characterized as having a smaller height than the peg at the air bearing surface or could be characterized as having both a smaller height and a smaller width (this dimension cannot be seen in this particular cross section). Sacrificial structures similar to that depicted in FIG. 6 could have the same height, but be narrower, could have the same width, but be thinner, or could be both narrower and thinner than the peg at the air bearing surface.

Disclosed NFTs also include a barrier structure 315 (or 415 in FIGS. 4A and 4B). The barrier structure 315 is generally positioned between the peg 305 and the disc 310. More specifically, the barrier structure 315 can be described as being positioned between the back region 306 of the peg and the first surface 311 of the disc 310. The barrier structure is in contact with at least part of the back region 306 of the peg. In some embodiments, the barrier structure 315 completely covers the back surface 308 of the peg 305. In some embodiments, the barrier structure at least covers the sacrificial structure (320 in FIG. 3 or 420 in FIG. 4) of the peg. In some embodiments, the configuration of the barrier structure is at least partially dictated by the configuration of the sacrificial structure because the barrier structure conforms to the shape of the sacrificial structure.

The barrier structure 315 is made of a material that functions as a barrier between the sacrificial structure of the peg and the disc. If the barrier structure were not present, voids within the disc and/or heatsink could migrate to the sacrificial structure, thereby defeating its intended purpose of drawing voids away from the air bearing region of the peg. The barrier structure may also prevent a disc/heatsink made of the same material as the peg from correcting the effects of the sacrificial region during deposition, because the disc/heatsink material could fill any openings and remove the effect of the sharp corners of the peg.

In some embodiments, the barrier structure can be made of a material that has a relatively high melting point, low solubility with the material(s) of the peg, disc, heatsink, or combinations thereof, relatively high thermal conductivity, relatively good thermal stability, or any combination thereof. In some embodiments, the barrier structure can be made of a metal. Illustrative metals can include, for example tungsten (W), rhodium (Rh), ruthenium (Ru), titanium (Ti), iridium (Ir), molybdenum (Mo), niobium (Nb), tantalum (Ta), nickel (Ni), hafnium (Hf), neodymium (Nd), holmium (Ho), zirconium (Zr), yttrium (Y), or combinations thereof. In some embodiments, the barrier structure can be made of tungsten (W). In some embodiments, the barrier structure can be made of titanium tungsten (TiW). In some embodiments, the barrier structure can be made of nitrides, carbides, silicides, or combinations thereof. In some embodiments, the barrier structure can be made of nitrides, carbides, silicides, or combinations thereof having desirable properties. In some embodiments, the barrier structure can be made of nitrides, carbides, silicides, or combinations thereof that have relatively good thermal conductivity, relatively good thermal stability, or combinations thereof. In some embodiments, the barrier structure can be made of aluminum nitride (AlN), boron nitride (BN), zirconium nitride (ZrN), chromium nitride (CrN), titanium aluminum nitride (TiAlN), titanium silicon nitride (TiSiN), titanium nitride (TiN), titanium carbide (TiC), tungsten carbide (WC), or combinations thereof. In some embodiments, the barrier structure can be a void, or a lack of material.

Considerations regarding dimensions can be based on various, often competing factors. From the standpoint of material properties, the sacrificial structure and the barrier structure are preferred to be closer to the air bearing surface of the peg so that the sacrificial structure can more effectively draw voids to it and so that the temperature difference between the sacrificial structure/barrier structure and the air bearing surface of the peg can be minimized. Furthermore, a smaller difference between the sacrificial structure and the air bearing surface provides a shorter diffusion length and thus more effective diffusion. From the standpoint of optical considerations, the sacrificial structure and the barrier structure should not be too close to the edge of the disc/heatsink so that the optical penalty can be minimized.

FIG. 3B shows a dimension d, to be the depth between the disc/peg interface and the front (towards the air bearing surface) of the barrier structure. In some embodiments, the depth, d, can be not greater than 60 nm, in some embodiments not greater than 50 nm, and in some embodiments not greater than 40 nm. In some embodiments, the depth, d, can be at least 15 nm, or in some embodiments, at least 20 nm. FIG. 3A shows a dimension, t, to be the thickness of the barrier structure. The thickness of the barrier structure affects optical properties, but the detrimental effect on it is less important than the need to have a thickness that provides an effective barrier. In some embodiments, the thickness, t, can be not greater than 30 nm, or in some embodiments not greater than 20 nm. In some embodiments, the thickness, t, can be at least 3 nm, or in some embodiments at least 5 nm.

An illustrative system was modeled to show the optical, and or thermal performance degradation of the position of a tungsten (W) barrier structure. The optical/thermal performance degrades at least 5% if a 5 nm thick tungsten (W) barrier structure extends to the outer surface of a gold disc/heatsink. The size of an optical spot that can be generated with such a NFT also increases. Increasing the tungsten barrier structure from a thickness of 5 nm to 15 nm increases the optical/thermal spot size produced from 9% (5 nm compared with no structure) to 28%, and Thermal penalty (MH ratio) goes from 13% to 28%. This increased spot width contributed to a wider write track and lower thermal gradient (TG), as well as a 5 to 12% performance degradation. The penalty is also determined by the proximity of the tungsten barrier layer to the peg and bottom disk. This modeling assumes that the layer is 5 nm above the peg, the penalty is smaller when the tungsten barrier layer is away from the peg and bottom disk. Based on these observations, reducing the volume of the barrier material (e.g, tungsten) by using a thinner barrier structure (e.g., 5 nm) the barrier structure can be placed as close as 20 nm to 30 nm from the outer surface of the disc with limited degradation on the optical performance. From the standpoint of processing considerations, overlap between the two photoresist patterns, one for the barrier structure formation and the other for the disc/heatsink formation can control the depth. The distance between the edge of the barrier structure and the edge of the disc can be controlled by photo overlay. The barrier structure material and the disc material can then be deposited through two separated lift off steps.

Also disclosed herein are methods of forming NFTs. In some embodiments, the methods can include forming a peg including a sacrificial structure; forming a barrier structure, and forming a disc. The step of forming a peg including a sacrificial structure can be accomplished using various deposition and patterning methods. One method of forming a peg is to use photolithography and hard mask to create a desired pattern, followed by ion beam milling into the NFT material. Formation of the sacrificial structure can be accomplished using photolithography processes and methods for example. In some embodiments, a sacrificial structure (e.g., sharp corner) can be created using a second photolithography step and ion beam milling in an already formed peg (without a sacrificial structure). Deposition of the disc/HS material can be accomplished using various deposition methods including for example physical vapor deposition (PVD), chemical vapor deposition (CVD), and atomic layer deposition (ALD).

Once the peg is formed, the barrier structure can then be formed. In some embodiments where the barrier structure is made of a material (instead of a void), the barrier structure can be formed using various deposition and patterning methods. Formation of the barrier structure can be accomplished using photolithography processes and methods for example. One method is to use photolithography to create a pattern, deposit the barrier material into the pattern and remove the photo resist afterwards. Deposition of the disc/HS material can be accomplished using various deposition methods including for example PVD, CVD, and ALD. In some embodiments where the barrier structure is a void (instead of a material), the barrier structure can be formed using various deposition and patterning methods. Formation of barrier structures that are voids can more specifically be accomplished using photolithography processes and methods, followed by a first disc/HS material deposition. This deposition can be done in such a way that it is with high directionality. Illustrative examples of such processes can include, for example, ion beam deposition (IBD), or ion-assisted PVD. By controlling the deposition angle, voids can be formed due to the shadowing effect from the photoresist patterns. After the void is formed, the photoresist can be removed. The remaining disc/HS material is formed through a second photoresist patterning and various deposition methods including for example physical vapor deposition (PVD), chemical vapor deposition (CVD), and atomic layer deposition (ALD).

Once the barrier structure has been formed, whether material containing or a void, the next step is to form the disc (and optionally heat sink). Formation of the disc can be accomplished using photolithography processes and methods for example. Deposition of the disc material (which may or may not be the same as the peg material) can be accomplished using various deposition methods including for example PVD, CVD, and ALD.

Other optional steps can be added to disclosed methods: the steps can be added in between the disclosed steps, before the disclosed steps, after the disclosed steps, or any combination thereof.

Figures 5A, 5B, 5C:
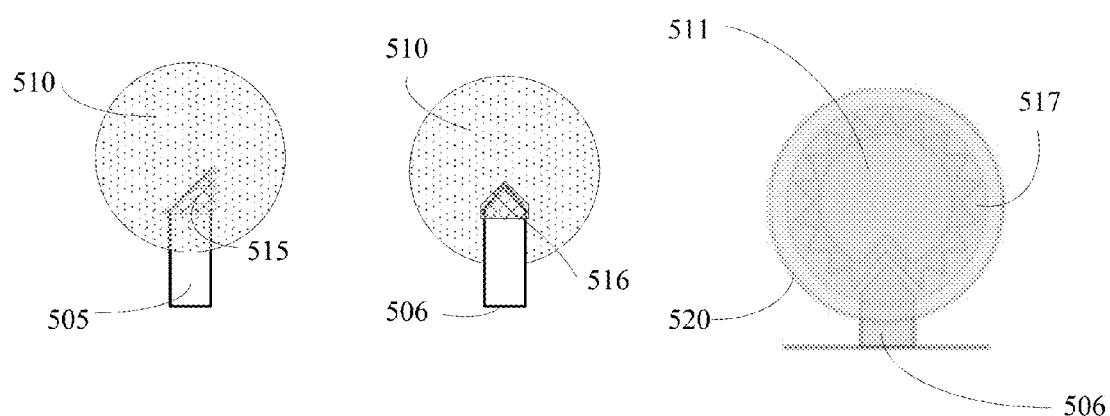
FIGS. 5A, 5B, and 5C are top down views of illustrative NFTs.

FIGS. 5A, 5B, and 5C show further illustrative combinations of pegs, discs and barrier structures. The NFT seen in FIG. 5A includes a peg 505 having a slanted sacrificial structure and a barrier structure 515 that has a similar footprint as the sacrificial structure. This NFT also includes a disc 510. FIG. 5B includes a peg 506 having a pointed sacrificial structure and a barrier structure 516 that has a similar footprint as the sacrificial structure. This NFT also includes a disc 510. NFTs that include sacrificial structures and barrier structures with matching footprints offer the advantage of having the sacrificial structure and the barrier structure while at the same time utilizing a minimum amount of non-plasmonic material (the barrier structure material) in order to minimize the optical penalty of having the material present. Sacrificial structures of the peg and barrier structures with similar footprints may also offer process options, for example, the sacrificial structure could be formed as part of the peg and then some portion of the sacrificial structure could be removed from most of the peg.

FIG. 5C includes a peg 506 that has a pointed sacrificial structure and a barrier structure 517. The disc 511, which has a "sun" like shape, in FIG. 5C also includes numerous sacrificial structures. The purpose of such a disc is to include void sinks in the disc as well. Such sacrificial structures may allow defects in the peg, the disc, the heatsink, or any combination thereof to preferentially migrate towards this region of the disc 511. Therefore, the barrier structure 517 in this case is large enough to be adjacent all of the sacrificial structures (those in the peg 506 and the disc 511). This depiction shows the heatsink 520 as well.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate).

Use of "first," "second," etc. in the description above and the claims that follow is also not necessarily intended to indicate that one comes earlier in time than the other.

Thus, embodiments of near field transducers having a sacrificial structure are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A near field transducer (NFT) comprising:
   a peg having an air bearing region and an opposing back region, the back region comprising a sacrificial structure,
   a disc having a first surface in contact with the peg, and
   a barrier structure, the barrier structure positioned between the opposing back region of the peg and the first surface of the disc.

2. The NFT according to claim 1, wherein the barrier structure comprises a metal.

3. The NFT according to claim 2, wherein the barrier structure comprises tungsten (W), rhodium (Rh), ruthenium (Ru), titanium (Ti), iridium (Ir), molybdenum (Mo), niobium (Nb), tantalum (Ta), nickel (Ni), hafnium (Hf), neodymium (Nd), holmium (Ho), zirconium (Zr), yttrium (Y), or combinations thereof.

4. The NFT according to claim 2, wherein the barrier structure comprises tungsten (W), rhodium (Rh), ruthenium (Ru), titanium (Ti), iridium (Ir), or combinations thereof.

5. The NFT according to claim 1, wherein the barrier structure comprises aluminum nitride (AlN), boron nitride (BN), zirconium nitride (ZrN), chromium nitride (CrN), titanium aluminum nitride (TiAlN), titanium silicon nitride (TiSiN), titanium nitride (TiN), titanium carbide (TiC), tungsten carbide (WC), or combinations thereof.

6. The NFT according to claim 1, wherein the barrier structure comprises a void.

7. The NFT according to claim 1, wherein the sacrificial structure comprises the back surface of the peg.

8. The NFT according to claim 1, wherein the sacrificial structure is at the back region of the peg comprises at least one angle less than 90 degrees.

9. The NFT according to claim 8, wherein the sacrificial structure comprises a slanted back surface.

10. The NFT according to 8, wherein the sacrificial structure comprises a pointed back surface.

11. The NFT according to claim 1, wherein the sacrificial structure is at the back region of the peg and has at least one dimension that is less than that same dimension at the air bearing surface of the peg.

12. A method of forming a near field transducer (NFT), the method comprising:
   forming a peg of the NFT, the peg having a peg having an air bearing region and an air bearing surface (ABS) and a back region, opposing the air bearing region, wherein the back region comprises a sacrificial structure;
   forming a barrier structure on at least the back region and the back surface of the peg; and
   forming a disc of the NFT, the disc positioned over at least the barrier structure.

13. The method according to claim 12, wherein the peg is formed using photopatterning.

14. The method according to claim 12, wherein formation of the barrier structure comprises photopatterning and deposition of a metal.

15. The method according to claim 12, wherein formation of the barrier structure is formed using photopatterning and angled deposition of the material of the disc.

16. A system comprising:
   a device comprising:
      an energy source;
      a waveguide, the waveguide configured to transmit energy from the energy source;
      a near field transducer (NFT) the NFT comprising:
         a peg having an air bearing region and an opposing back region, the back region comprising a sacrificial structure,
         a disc having a first surface in contact with the peg, and
         a barrier structure, the barrier structure positioned between the opposing back region of the peg and the first surface of the disc; and
      wherein the energy source is configured to transmit energy to the waveguide and the waveguide is configured to transmit energy to the NFT; and
      a magnetic writer; and
   magnetic recording media,
   wherein energy from the energy source is transmitted via the waveguide to the NFT and the NFT transmits energy to the magnetic recording media to assist the magnetic writer in writing data to the magnetic recording media.

17. The system according to claim 16, wherein the barrier structure comprises a metal.

18. The system according to claim 16, wherein the barrier structure comprises a void.

19. The system according to claim 16, wherein the peg further comprises an air bearing surface (ABS), and wherein the back region of the peg has a back surface that is oblique to the air bearing surface of the NFT.

20. The system according to claim 16, wherein the sacrificial structure comprises the back surface of the peg and the sacrificial structure comprises at least one angle less than 90 degrees.

* * * * *